United States Patent
Huo et al.

(10) Patent No.: US 8,452,994 B2
(45) Date of Patent: May 28, 2013

(54) POWER SUPPLY UNIT AND ELECTRONIC APPARATUS USING THE SAME

(75) Inventors: Wei Huo, Shenzhen (CN); Hui Yin, Shenzhen (CN); Bo-Ching Lin, Taipei Hsien (TW); Han-Che Wang, Taipei Hsien (TW)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 404 days.

(21) Appl. No.: 12/888,426

(22) Filed: Sep. 23, 2010

(65) Prior Publication Data
US 2012/0025895 A1    Feb. 2, 2012

(30) Foreign Application Priority Data
Jul. 28, 2010    (CN) .......................... 2010 1 0239220

(51) Int. Cl.
*G06F 1/00*    (2006.01)

(52) U.S. Cl.
USPC ................... 713/300; 713/1; 713/2; 713/310; 713/320

(58) Field of Classification Search
USPC .................................. 713/1, 2, 300, 310, 320
See application file for complete search history.

(56) References Cited

U.S. PATENT DOCUMENTS

| | | | | |
|---|---|---|---|---|
| 5,182,810 A * | 1/1993 | Bartling et al. | ............... | 713/323 |
| 5,712,973 A * | 1/1998 | Dayan et al. | .................... | 726/36 |
| 5,754,868 A * | 5/1998 | Yamamoto et al. | ........... | 713/300 |
| 6,275,949 B1 * | 8/2001 | Watanabe | ..................... | 713/324 |
| 2004/0177282 A1 * | 9/2004 | Twu | ................... | 713/300 |
| 2006/0190737 A1 * | 8/2006 | Miyasaka | .................... | 713/185 |
| 2007/0061601 A1 * | 3/2007 | Park | ................... | 713/300 |
| 2010/0115297 A1 * | 5/2010 | Dathe et al. | ................... | 713/300 |
| 2010/0141048 A1 * | 6/2010 | Hou | .............. | 307/130 |

FOREIGN PATENT DOCUMENTS

JP    2004-357445 A    12/2004

* cited by examiner

*Primary Examiner* — Kim Huynh
*Assistant Examiner* — Zahid Choudhury
(74) *Attorney, Agent, or Firm* — Altis Law Group, Inc.

(57) ABSTRACT

An electronic apparatus capable of saving power is provided. The electronic apparatus includes a buffer, a central processing unit (CPU), and a power supply unit. The power supply unit includes a mechanical switch circuit, a first switch circuit, and a second switch circuit. The first switch circuit is capable of being turned on by the mechanical switch circuit to receive power from a power input port and providing power to the buffer. The second switch circuit is capable of being turned on by the mechanical switch circuit to receive power from the power input port through the first switch circuit and providing power to the CPU, and the CPU being operable to generate a control signal to turn off the second switch circuit to interrupt the power provided to the CPU.

16 Claims, 2 Drawing Sheets

POWER SUPPLY UNIT AND ELECTRONIC APPARATUS USING THE SAME

BACKGROUND

1. Technical Field

The present disclosure relates to electronic apparatuses and power supply units and, particularly, to an electronic apparatus using a power supply unit that can save power.

2. Description of the Related Art

For an electronic ink (E-ink) display apparatus, when the central processing unit (CPU) of the display apparatus is powered off, content currently on display remains visible. During the times when there is no need to update the content on display the CPU can be turned off to save power. However, when readers want to update the display, they must restore power to the CPU, and wait for the CPU to retrieve data needed to update the E-ink display, which reduces user satisfaction.

BRIEF DESCRIPTION OF THE DRAWINGS

The components in the drawings are not necessarily drawn to scale, the emphasis instead being placed upon clearly illustrating the principles of an electronic apparatus. Moreover, in the drawings, like reference numerals designate corresponding parts throughout the several views.

DETAILED DESCRIPTION

Figure 1:
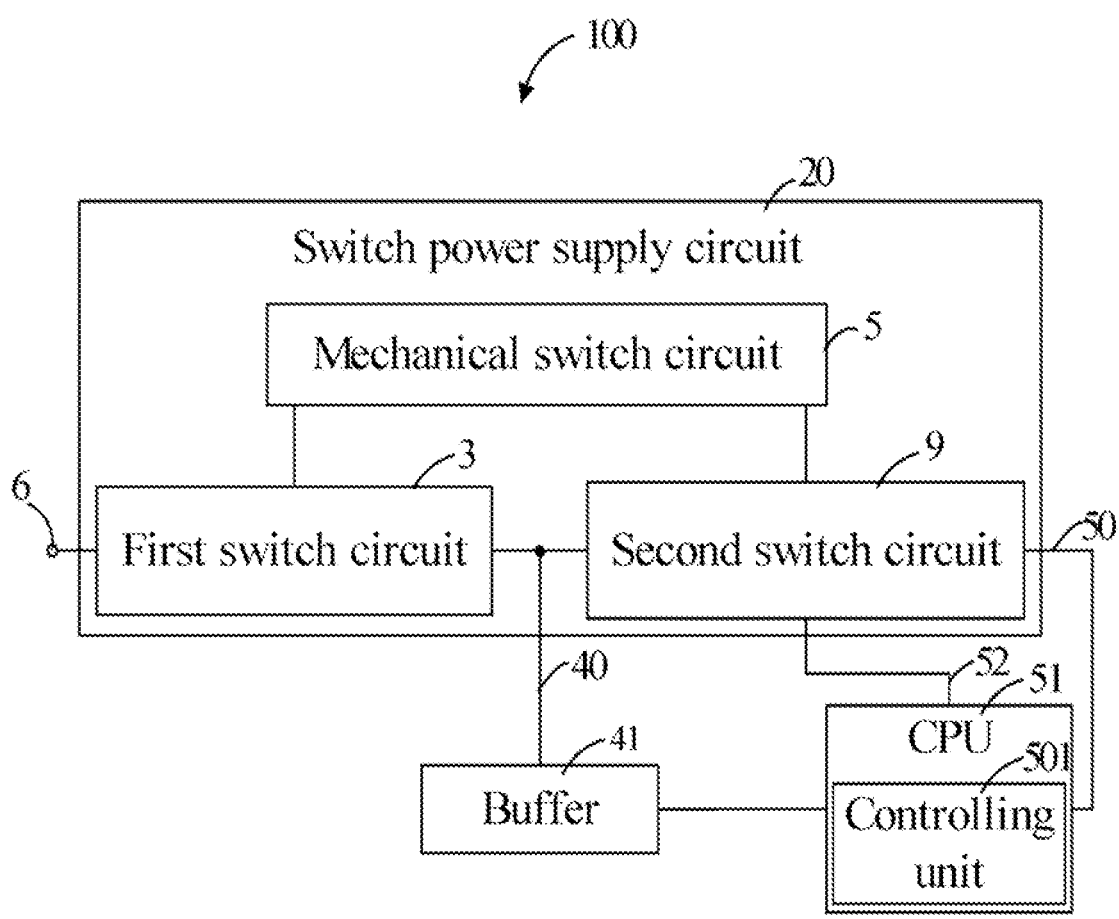
FIG. 1 is a block diagram of an electronic apparatus in accordance with an exemplary embodiment.

Referring to FIG. 1, an electronic apparatus 100 includes a power supply unit 20, a central processing unit (CPU) 51, and a buffer 41. The power supply unit 20 receives power from a power input port 6, and supplies power to the buffer 41 through a first voltage output 40 and to the CPU 51 through a second voltage output 50. The CPU 51 is configured to obtain data from the buffer 41 and displays the data on a display (not shown) of the electronic apparatus 100. In the embodiment, the apparatus 100 is an e-reader with an electronic ink (E-ink) display.

Figure 2:
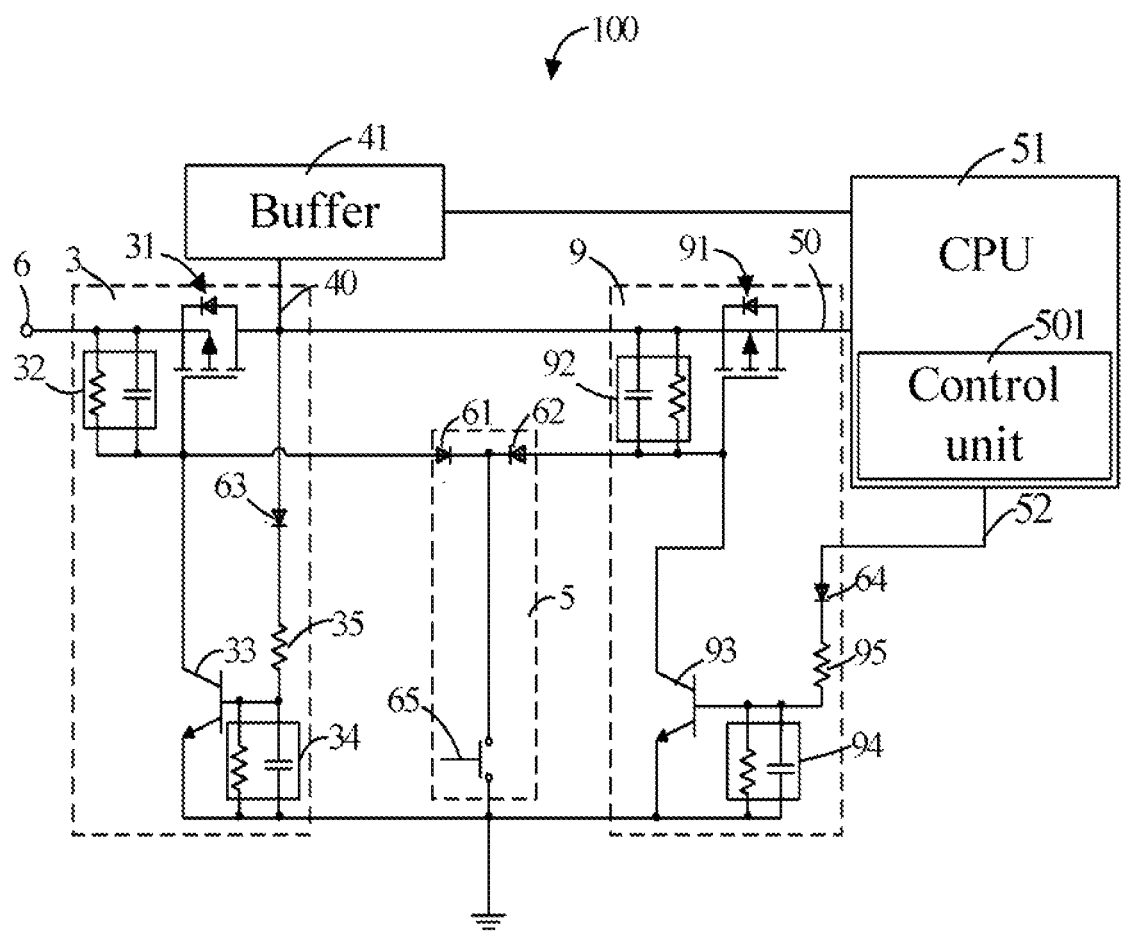
FIG. 2 is a circuit diagram of the electronic apparatus of FIG. 1.

Referring to FIG. 2, in one embodiment, the switch power supply unit 20 includes a mechanical switch circuit 5, a first switch circuit 3, and a second switch circuit 9. The mechanical switch circuit 5 includes a mechanical switch 65. When the mechanical switch 65 is depressed, both the switch circuits 3 and 9 are simultaneously turned on. Therefore, power from the input port 6 is provided to the buffer 41 through the first switch circuit 3, and provided to the CPU 51 through the first switch circuit 3 and the second switch circuit 9. In the embodiment, both the switch circuits 3 and 9 are turned off by a main power switch (not shown) of the apparatus 10.

In the embodiment, the CPU 51 includes a control unit 501 configured for generating a control signal to turn off the second switch circuit 9. In this embodiment, if the electronic apparatus 10 does not receive any operation signal during a predetermined time interval, the control unit 501 generates the control signal. In an alternative embodiment, a mechanical key is employed to control the control module 501 to generate the control signal.

The mechanical switch circuit 5 further includes a first diode 61 and a second diode 62. The cathodes of the first diode 61 and the second diode 62 are grounded via the mechanical switch 65. The anode of the first diode 61 is connected to the first switch circuit 3, and the anode of the second diode 62 is connected to the second switch circuit 9.

The first switch circuit 3 includes a first transistor 31, a first filter 32, a second transistor 33, a second filter 34, a first resistor 35, and a third diode 63. The filter 32 includes a resistor (not labeled) and a capacitor (not labeled) connected in parallel. The filter 34 has the same structure as the filter 32.

In this embodiment, the first transistor 31 is a PMOS (P-channel metal-oxide-semiconductor field-effect) transistor, and the second transistor 33 is an NPN type transistor. The source of the transistor 31 is connected to the input port 6, the gate of the transistor 31 is connected to the collector of the transistor 33, and the drain of the transistor 31 is connected to the cathode of the third diode 63. The filter 32 is connected between the source and the gate of the transistor 31. The buffer 41 is connected to the drain of the transistor 31 to receive power through the first voltage output 40. The base of the transistor 33 is connected to the anode of the third diode 63 via the first resistor 35, and the emitter of the transistor 33 is grounded. The filter 34 is connected between the base and the emitter of the transistor 33.

The second switch circuit 9 is connected to the first switch circuit 3 in series. The second switch circuit 9 includes a third transistor 91, a third filter 92, a fourth transistor 93, a fourth filter 94, a second resistor 95, and a fourth diode 64.

In this embodiment, the third transistor 91 is a PMOS (P-channel metal-oxide-semiconductor field-effect) transistor, and the fouth transistor 93 is an NPN type transistor. The source of the transistor 91 is connected to the first voltage output 40, the gate of the transistor 91 is connected to the collector of the transistor 93, and the drain of the transistor 91 is connected to the CPU 51 through the second voltage output 50. The filter 92 is connected between the source and the gate of the transistor 91. The base of the transistor 93 is connected to the anode of the fourth diode 54 through the second resistor 95, and the emitter of the transistor 93 is grounded. The filter 94 is connected between the base and the emitter of the transistor 93.

If the electronic apparatus 10 receives no operational signal during the predetermined time interval, the control unit 501 generates and transmits a low level signal through the fourth diode 64 and the second resistor 9 to turn off the transistor 93. The gate of the transistor 91 is grounded through the transistor 93, thus the transistor 91 is turned off to power off the CPU 51. However, the power of the buffer 41 is still maintained through the first switch circuit 3. Therefore, when there is no need at the moment to update the content on the E-ink, the CPU 51 enters a power saving mode, while the buffer 41 remains on, so that data, such as content for a next update of the E-ink display in the buffer will not be lost.

If content on the E-ink display needs to be updated, users can press the mechanical switch 65 to turn on the second switch circuit 9. The CPU 51 thus receives power via the second switch circuit 9 and immediately enters a work mode. As the buffer 41 is already powered on and has kept the content needed for the next update, the CPU 51 can directly obtain the content from the butter 41 and update the E-ink display very quickly.

It is understood that the disclosure may be embodied in other forms without departing from the spirit thereof. Thus, the present examples and embodiments are to be considered in all respects as illustrative and not restrictive, and the disclosure is not to be limited to the details given herein.

What is claimed is:

1. An electronic apparatus comprising:
   a buffer;
   a central processing unit (CPU); and a switch power supply unit comprising:
   a mechanical switch circuit comprising a mechanical switch;
   a first switch circuit capable of being turned on by depressing the mechanical switch to receive power from a power input port and providing power to the buffer, the first switch circuit comprising a first filter, configured for maintaining the first switch circuit on after resetting the depressed mechanical switch; and
   a second switch circuit capable of being turned on by depressing the mechanical switch to receive power from the power input port through the first switch circuit and providing power to the CPU, the second switch circuit comprising a second filter, configured for maintaining the second switch circuit on after resetting the depressed mechanical switch; and the CPU being operable to generate a control signal to turn off the second switch circuit to interrupt the power provided to the CPU.

2. The electronic apparatus as claimed in claim 1, wherein the mechanical switch circuit further comprises a first diode and a second diode, the cathode of the first diode and the second diode are grounded through the mechanical switch, the anode of the first diode is connected to the first switch circuit, and the anode of the second diode is connected to the second switch circuit.

3. The electronic apparatus as claimed in claim 1, wherein the CPU comprises a control unit, when the electronic apparatus does not receive any operation signal during a predetermined time interval, the control unit generates the control signal.

4. The electronic apparatus as claimed in claim 1, wherein the first switch circuit comprising a PMOS (P-channel metal-oxide-semiconductor field-effect) transistor and an NPN type transistor; the source of the PMOS transistor is connected to the input port, the gate of the PMOS transistor is connected to the collector of the NPN transistor, and the drain of the PMOS transistor is connected to the cathode of a third diode and the first voltage output port; the first filter is connected between the source and the gate of the PMOS transistor; the base of the NPN transistor is connected to the anode of the third diode through a first resistor, the emitter of the NPN transistor is grounded.

5. The electronic apparatus as claimed in claim 1, wherein the first switch circuit comprising a PMOS (P-channel metal-oxide-semiconductor field-effect) transistor and an NPN type transistor; the first terminal of the PMOS transistor is connected to the input port, the second terminal of the PMOS transistor is connected to the first terminal of the NPN transistor, and the third terminal of the PMOS transistor is connected to the cathode of a third diode and the first voltage output port; the first filter is connected between the first terminal and the second terminal of the PMOS transistor; the second terminal of the NPN transistor is connected to the anode of the third diode through a first resistor, and the third terminal of the NPN transistor is grounded.

6. The electronic apparatus as claimed in claim 1, wherein the second switch circuit comprising a PMOS (P-channel metal-oxide-semiconductor field-effect) transistor and an NPN type transistor; the source of the PMOS transistor is connected to the first voltage output port, the gate of the PMOS transistor is connected to the collector of the NPN transistor, and the drain of the PMOS transistor is connected to the second voltage output port; the second filter is connected between the source and the gate of the PMOS transistor; the base of the NPN transistor is connected to the anode of a fourth diode through a second resistor, and the emitter of the NPN transistor is grounded.

7. The electronic apparatus as claimed in claim 1, wherein the second switch circuit comprising a PMOS (P-channel metal-oxide-semiconductor field-effect) transistor and an NPN type transistor; the first terminal of the PMOS transistor is connected to the first voltage output port, the second terminal of the PMOS transistor is connected to the first terminal of the NPN transistor, and the third terminal of the PMOS transistor is connected to the second voltage output port; the second filter is connected between the first terminal and the second terminal of the PMOS transistor; the second terminal of the NPN transistor is connected to the anode of a fourth diode through a second resistor, and the third terminal of the NPN transistor is grounded.

8. The electronic apparatus as claimed in claim 1, wherein the second switch circuit connected to the first switch circuit in series.

9. A switch power supply unit providing power to an electronic apparatus comprising a buffer and a central processing unit (CPU); comprising:
   a mechanical switch circuit comprising a mechanical switch;
   a first switch circuit capable of being turned on by depressing the mechanical switch to receive power from a power input port and providing power to the buffer, the first switch circuit comprising a first filter, configured for maintaining the first switch circuit on after resetting the depressed mechanical switch; and
   a second switch circuit capable of being turned on by depressing the mechanical switch to receive power from the power input port through the first switch circuit and providing power to the CPU, the second switch circuit comprising a second filter, configured for maintaining the second switch circuit on after resetting the depressed mechanical switch; and the CPU being operable to generate a control signal to turn off the second switch circuit to interrupt the power provided to the CPU.

10. The switch power supply unit as claimed in claim 9, wherein the mechanical switch circuit further comprises a first diode and a second diode, the cathode of the first diode and the second diode are grounded through the mechanical switch, the anode of the first diode is connected to the first switch circuit, and the anode of the second diode is connected to the second switch circuit.

11. The switch power supply unit as claimed in claim 9, wherein the CPU comprises a control unit, when the electronic apparatus does not receive any operation signal during a predetermined time interval, the control unit generates the control signal.

12. The switch power supply unit as claimed in claim 9, wherein the first switch circuit comprising a PMOS (P-channel metal-oxide-semiconductor field-effect) transistor and an NPN type transistor; the source of the PMOS transistor is connected to the input port, the gate of the PMOS transistor is connected to the collector of the NPN transistor, and the drain of the PMOS transistor is connected to the cathode of a third diode and the first voltage output port; the first filter is connected between the source and the gate of the PMOS transistor; the base of the NPN transistor is connected to the anode of the third diode through a first resistor, the emitter of the NPN transistor is grounded.

13. The switch power supply unit as claimed in claim 9, wherein the first switch circuit comprising a PMOS (P-channel metal-oxide-semiconductor field-effect) transistor and an NPN type transistor; the first terminal of the PMOS transistor is connected to the input port, the second terminal of the PMOS transistor is connected to the first terminal of the NPN transistor, and the third terminal of the PMOS transistor is connected to the cathode of a third diode and the first voltage output port; the first filter is connected between the first terminal and the second terminal of the PMOS transistor; the second terminal of the NPN transistor is connected to the anode of the third diode through a first resistor, and the third terminal of the NPN transistor is grounded.

14. The switch power supply unit as claimed in claim 9, wherein the second switch circuit comprising a PMOS (P-channel metal-oxide-semiconductor field-effect) transistor and an NPN type transistor; the source of the PMOS transistor is connected to the first voltage output port, the gate of the PMOS transistor is connected to the collector of the NPN transistor, and the drain of the PMOS transistor is connected to the second voltage output port; the second filter is connected between the source and the gate of the PMOS transistor; the base of the NPN transistor is connected to the anode of a fourth diode through a second resistor, and the emitter of the NPN transistor is grounded.

15. The switch power supply unit as claimed in claim 9, wherein the second switch circuit comprising a PMOS (P-channel metal-oxide-semiconductor field-effect) transistor and an NPN type transistor; the first terminal of the PMOS transistor is connected to the first voltage output port, the second terminal of the PMOS transistor is connected to the first terminal of the NPN transistor, and the third terminal of the PMOS transistor is connected to the second voltage output port; the second filter is connected between the first terminal and the second terminal of the PMOS transistor; the second terminal of the NPN transistor is connected to the anode of a fourth diode through a second resistor, and the third terminal of the NPN transistor is grounded.

16. The switch power supply unit as claimed in claim 9, wherein the second switch circuit connected to the first switch circuit in series.

* * * * *